US012737606B2

(12) United States Patent
Busch et al.

(10) Patent No.: US 12,737,606 B2
(45) **Date of Patent: *Sep. 15, 2026**

(54) SYSTEMS AND METHODS OF SPARSITY EXPLOITING

(71) Applicant: SYNTIANT, Irvine, CA (US)

(72) Inventors: Kurt F. Busch, Laguna Hills, CA (US); Jeremiah H. Holleman, III, Davidson, NC (US); Pieter Vorenkamp, Laguna Beach, CA (US); Stephen W. Bailey, Irvine, CA (US)

(73) Assignee: SYNTIANT, Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/522,075

(22) Filed: Nov. 28, 2023

(65) Prior Publication Data

US 2024/0095510 A1 Mar. 21, 2024

Related U.S. Application Data

(63) Continuation of application No. 17/581,453, filed on Jan. 21, 2022, now Pat. No. 11,868,876, which is a (Continued)

(51) Int. Cl.
*G06N 3/065* (2023.01)
*G06N 3/0495* (2023.01)

(Continued)

(52) U.S. Cl.
CPC ........... *G06N 3/065* (2023.01); *G06N 3/0495* (2023.01); *G06N 3/08* (2013.01); *G06N 3/084* (2013.01);

(Continued)

(58) Field of Classification Search
CPC ............ G06N 3/04; G06N 3/065; G06N 3/08; G06N 3/084; G06N 3/105; H03K 19/0944;

(Continued)

(56) References Cited

U.S. PATENT DOCUMENTS 4,084,256 A * 4/1978 Engeler ................ G06G 7/1907 257/241
4,906,873 A * 3/1990 Shoemaker ............ G06G 7/163 327/306

(Continued)

OTHER PUBLICATIONS

Van den Bout, D., et al. "Scalable VLSI implementations for neural networks." Journal of VLSI signal processing systems for signal, image and video technology 1.4 (1990): 367-385. (Year: 1990).*

(Continued)

*Primary Examiner* — Randall K. Baldwin
(74) *Attorney, Agent, or Firm* — Rutan & Tucker LLP; Hani Z. Sayed; Ravi Mohan

(57) ABSTRACT

Disclosed is a neuromorphic integrated circuit including, in some embodiments, a multi-layered neural network disposed in an analog multiplier array of two-quadrant multipliers. Each multiplier of the multipliers is wired to ground and draws a negligible amount of current when input signal values for input signals to transistors of the multiplier are approximately zero, weight values of the transistors of the multiplier are approximately zero, or a combination thereof Also disclosed is a method of the neuromorphic integrated circuit including, in some embodiments, training the neural network; tracking rates of change for the weight values; determining if and how quickly certain weight values are trending toward zero; and driving those weight values toward zero, thereby encouraging sparsity in the neural network. Sparsity in the neural network combined with the multipliers wired to ground minimizes power consumption of the neuromorphic integrated circuit such that battery power is sufficient for power.

18 Claims, 4 Drawing Sheets

Figure 2:
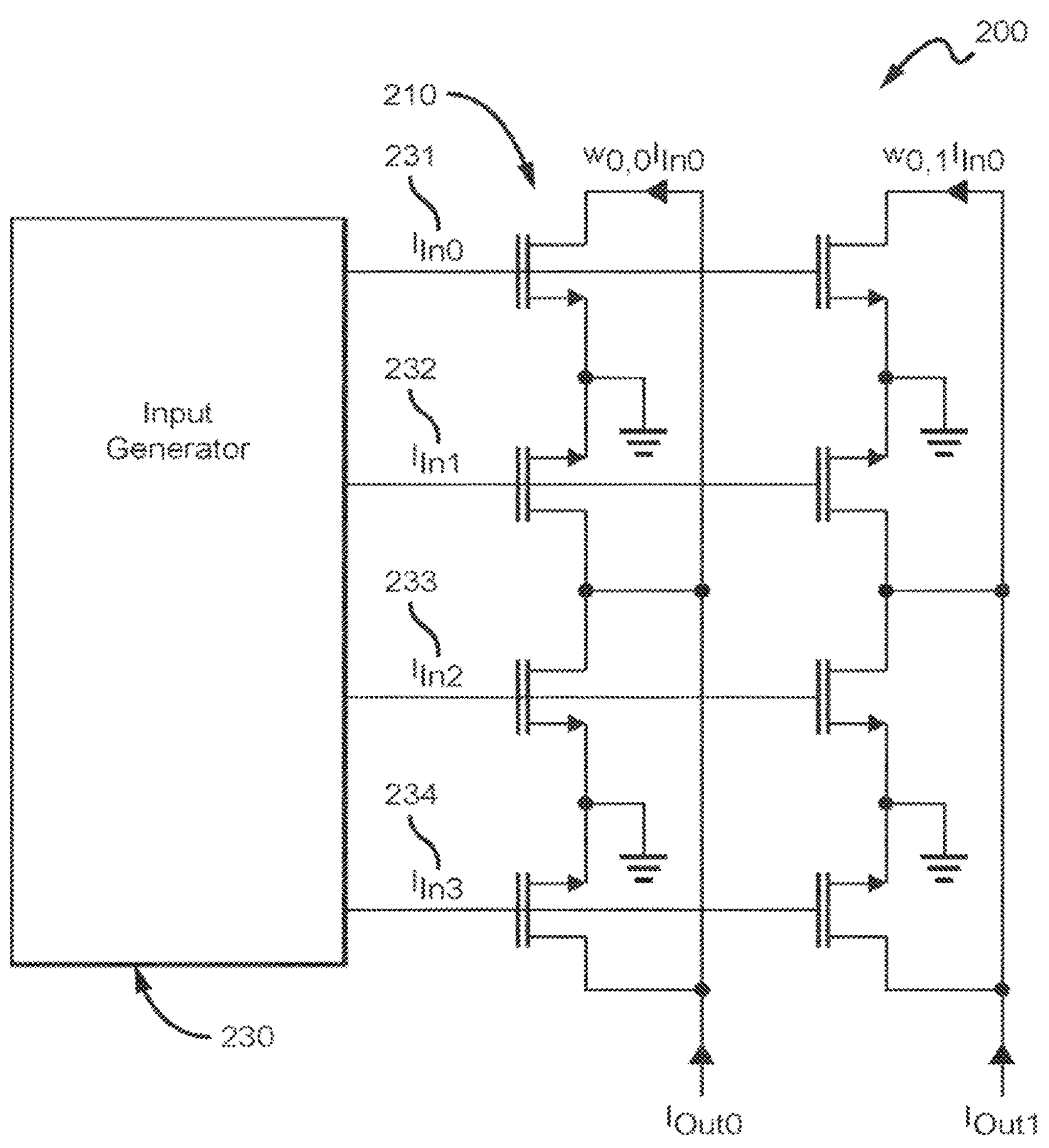

Related U.S. Application Data continuation of application No. 16/041,565, filed on Jul. 20, 2018, now Pat. No. 11,232,349.

(60) Provisional application No. 62/535,705, filed on Jul. 21, 2017.

(51) Int. Cl.

| | |
|---|---|
| ***G06N 3/08*** | (2023.01) |
| ***G06N 3/084*** | (2023.01) |
| ***G06N 3/10*** | (2006.01) |
| ***H03K 19/0944*** | (2006.01) |

(52) U.S. Cl.

CPC ......... *G06N 3/105* (2013.01); *H03K 19/0944* (2013.01)

(58) Field of Classification Search

CPC ........ G06K 9/66; G06K 9/6268; H05K 13/08; G01N 2021/8887; G01N 2021/95638; G01N 21/956; G01N 21/8851; B07C 5/34

See application file for complete search history.

(56) References Cited

U.S. PATENT DOCUMENTS

| | | | | |
|---|---|---|---|---|
| 4,950,917 A * | 8/1990 | Holler | G06N 3/065 | 257/E27.103 |
| 5,216,751 A * | 6/1993 | Gardner | G06N 3/063 | 706/42 |
| 5,298,796 A * | 3/1994 | Tawel | G06N 3/065 | 257/323 |
| 5,336,937 A * | 8/1994 | Sridhar | G06N 3/065 | 326/112 |
| 5,357,476 A * | 10/1994 | Kuo | G11C 16/16 | 365/185.26 |
| 5,479,578 A * | 12/1995 | Engeler | G06N 3/065 | 706/34 |
| 11,232,349 B2 * | 1/2022 | Busch | G06N 3/065 | |
| 11,868,876 B2 * | 1/2024 | Busch | G06N 3/065 | |
| 2010/0033228 A1 * | 2/2010 | Gershenfeld | G06F 7/388 | 327/334 |
| 2010/0241601 A1 * | 9/2010 | Carson | G06N 3/02 | 706/27 |
| 2014/0333875 A1 * | 11/2014 | Cheng | G02F 1/13471 | 349/96 |
| 2018/0174026 A1 * | 6/2018 | Davies | G06N 3/063 | |
| 2021/0019609 A1 * | 1/2021 | Strukov | G11C 16/0425 | |

OTHER PUBLICATIONS

Hollis, Paul W., and John J. Paulos. "Artificial neural networks using MOS analog multipliers." IEEE Journal of Solid-State Circuits 25.3 (1990): 849-855. (Year: 1990).*

Kub, Francis J., et al. "Programmable analog vector-matrix multipliers." IEEE Journal of Solid-State Circuits 25.1 (1990): 207-214. (Year: 1990).*

Indiveri, G., and G. M. Bisio. "Analog subthreshold VLSI implementation of a neuromorphic model of the visual cortex for pre-attentive vision." Proceedings of the Fourth International Conference on Microelectronics for Neural Networks and Fuzzy Systems. IEEE, 1994: 439-448 (Year: 1994).*

Indiveri, Giacomo. Current Mode Subthreshold Analog MOS Components for Neuromorphic Processing. Technical Report, Jan. 4, 1994, Retrieved from the Internet: URL: http://ncs. ethz. ch/pubs/pdf/Indiveri94. pdf, 1994: 1-12 (Year: 1994).*

Graupner, A., and R. Schüffny. "An ultra-low-power switched-current 2-quadrant multiplier." 2nd Electronic Circuits and Systems Conference ECS. vol. 99. 1999: 1-4 (Year: 1999).*

Kim, Sung. Low-power Design of a Neuromorphic IC and MICS Transceiver. Diss. Arizona State University, 2011: 1-83 (Year: 2011).*

Ramakrishnan, Shubha. A System Design Approach to Neuromorphic Classifiers. Diss. Georgia Institute of Technology, 2013: i-123 (Year: 2013).*

Thakur, Chetan Singh, et al. "A Trainable Neuromorphic Integrated Circuit that Exploits Device Mismatch." arXiv preprint arXiv: 1507.02835 (2015): 1-10 (Year: 2015).*

Han, Song, et al. "Learning both weights and connections for efficient neural network." Advances in neural information processing systems 28 (2015): 1-9 (Year: 2015).*

Maliuk, Dzmitry, and Yiorgos Makris. "An experimentation platform for on-chip integration of analog neural networks: A pathway to trusted and robust analog/RF ICs." IEEE transactions on neural networks and learning systems 26.8 (2014): 1721-1734. (Year: 2015).*

Reagen, Brandon, et al. "Minerva: Enabling low-power, highly-accurate deep neural network accelerators." 2016 ACM/IEEE 43rd Annual International Symposium on Computer Architecture (ISCA). IEEE, 2016: 267-278 (Year: 2016).*

Binas, Jonathan, et al. "Precise neural network computation with imprecise analog devices." arXiv preprint arXiv: 1606.07786 v1 ( 2016). (Year: 2016).*

* cited by examiner

FIG. 1

SYSTEMS AND METHODS OF SPARSITY EXPLOITING

PRIORITY

This application is a continuation of U.S. application Ser. No. 17/581,453, filed Jan. 21, 2022, now U.S. Pat. No. 11,868,876, which is a continuation of U.S. application Ser. No. 16/041,565, filed Jul. 20, 2018, now U.S. Pat. No. 11,232,349, which claims the benefit of priority to U.S. Provisional Patent Application No. 62/535,705, filed Jul. 21, 2017. The entire contents of the foregoing applications are hereby incorporated by reference.

FIELD

Embodiments of the disclosure related to the field of neuromorphic computing. More specifically, embodiments of the disclosure relate to systems and methods for encouraging sparsity in a neural network of a neuromorphic integrated circuit and minimizing power consumption of the neuromorphic integrated circuit.

BACKGROUND

Traditional central processing units ("CPUs") process instructions based on "clocked time." Specifically, CPUs operate such that information is transmitted at regular time intervals. Based on complementary metal—oxide—semiconductor ("CMOS") technology, silicon-based chips may be manufactured with more than 5 billion transistors per die with features as small as 10 nm. Advances in CMOS technology have been parlayed into advances in parallel computing, which is used ubiquitously in cell phones and personal computers containing multiple processors.

However, as machine learning is becoming commonplace for numerous applications including bioinformatics, computer vision, video games, marketing, medical diagnostics, online search engines, etc., traditional CPUs are often not able to supply a sufficient amount of processing capability while keeping power consumption low. In particular, machine learning is a subsection of computer science directed to software having the ability to learn from and make predictions on data. Furthermore, one branch of machine learning includes deep learning, which is directed at utilizing deep (multilayer) neural networks.

Currently, research is being done to develop direct hardware implementations of deep neural networks, which may include systems that attempt to simulate "silicon" neurons (e.g., "neuromorphic computing"). Neuromorphic chips (e.g., silicon computing chips designed for neuromorphic computing) operate by processing instructions in parallel (e.g., in contrast to traditional sequential computers) using bursts of electric current transmitted at non-uniform intervals. As a result, neuromorphic chips require far less power to process information, specifically, artificial intelligence ("AI") algorithms. To accomplish this, neuromorphic chips may contain as much as five times as many transistors as a traditional processor while consuming up to 2000 times less power. Thus, the development of neuromorphic chips is directed to provide a chip with vast processing capabilities that consumes far less power than conventional processors. Further, neuromorphic chips are designed to support dynamic learning in the context of complex and unstructured data.

There is an ongoing need for the development of neuromorphic chips with vast processing capabilities that consume far less power than conventional processors. Provided herein are systems and methods for encouraging sparsity in neural networks of neuromorphic chips and minimizing power consumption of the neuromorphic chips.

SUMMARY

Disclosed herein is a neuromorphic integrated circuit including, in some embodiments, a multi-layered neural network disposed in an analog multiplier array of a number of two-quadrant multipliers arranged in a memory sector of the neuromorphic integrated circuit. Each multiplier of the multipliers is wired to ground and draws a negligible amount of current when input signal values for input signals to transistors of the multiplier are approximately zero, weight values of the transistors of the multiplier are approximately zero, or a combination thereof. Sparsity in the neural network combined with the number of multipliers wired to ground minimizes power consumption of the neuromorphic integrated circuit.

In some embodiments, each multiplier of the multipliers draws no current when the input signal values for the input signals to the transistors of the multiplier are zero, the weight values of the transistors of the multiplier are zero, or a combination thereof In some embodiments, the weight values correspond to synaptic weight values between neural nodes in the neural network disposed in the neuromorphic integrated circuit.

In some embodiments, input signal values multiplied by the weight values provide output signal values that are combined to arrive at a decision of the neural network.

In some embodiments, the transistor of the two-quadrant multipliers includes a metal-oxide-semiconductor field-effect transistor ("MOSFET").

In some embodiments, each two-quadrant multiplier of the two-quadrant multipliers has a differential structure configured to allow programmatic compensation for overshoot if any one of two cells is set with a higher weight value than targeted.

In some embodiments, the neuromorphic integrated circuit is configured for one or more application specific standard products ("AS SPs") selected from keyword spotting, speaker identification, one or more audio filters, gesture recognition, image recognition, video object classification and segmentation, and autonomous vehicles including drones.

In some embodiments, the neuromorphic integrated circuit is configured to operate on battery power.

Also disclosed herein is a method of a neuromorphic integrated circuit including, in some embodiments, training a multi-layered neural network disposed in an analog multiplier array of a number of two-quadrant multipliers in a memory sector of a neuromorphic integrated circuit and encouraging sparsity in the neural network during the training. Each multiplier of the multipliers is wired to ground and draws a negligible amount of current when input signal values for input signals to transistors of the multiplier are approximately zero, weight values of the transistors of the multiplier are approximately zero, or a combination thereof. Encouraging sparsity in the neural network includes training with a training algorithm configured to drive a substantial number of the input signal values, the weight values, or the combination thereof toward zero for the multipliers, thereby enabling minimal power consumption by the neuromorphic integrated circuit.

In some embodiments, each multiplier of the multipliers draws no current when the input signal values for the input signals to the transistors of the multiplier are zero, the weight values of the transistors of the multiplier are zero, or a combination thereof In some embodiments, the method further includes tracking rates of change for the weight values of each multiplier of the multipliers during the training and determining if certain weight values are trending toward zero and how quickly those certain weight values are trending toward zero.

In some embodiments, the method further includes driving the weight values toward zero for those weight values that are trending toward zero during training as part of encouraging sparsity in the neural network.

In some embodiments, the weight values correspond to synaptic weight values between neural nodes in the neural network of the neuromorphic integrated circuit.

In some embodiments, the method further includes incorporating the neuromorphic integrated circuit in one or more ASSPs selected from keyword spotting, speaker identification, one or more audio filters, gesture recognition, image recognition, video object classification and segmentation, and autonomous vehicles including drones.

In some embodiments, the neuromorphic integrated circuit is configured to operate on battery power Also disclosed herein is method of a neuromorphic integrated circuit including, in some embodiments, training a multi-layered neural network disposed in an analog multiplier array of a number of two-quadrant multipliers in a memory sector of a neuromorphic integrated circuit; tracking rates of change for the weight values of each multiplier of the multipliers during the training; determining if certain weight values are trending toward zero and how quickly those weight values are trending toward zero; and driving the weight values toward zero for those weight values that are trending toward zero, thereby encouraging sparsity in the neural network. Each multiplier of the multipliers is wired to ground and draws a negligible amount of current when input signal values for input signals to transistors of the multiplier are approximately zero, weight values of the transistors of the multiplier are approximately zero, or a combination thereof.

In some embodiments, each multiplier of the multipliers draws no current when the input signal values for the input signals to the transistors of the multiplier are zero, the weight values of the transistors of the multiplier are zero, or a combination thereof In some embodiments, the method further includes setting a subset of the weight values to zero before training the neural network, thereby further encouraging sparsity in the neural network.

In some embodiments, the training is with a training algorithm configured to drive a substantial number of the input signal values, the weight values, or the combination thereof toward zero for the multipliers, thereby enabling minimal power consumption by the neuromorphic integrated circuit.

In some embodiments, the training encourages sparsity in the neural network by minimizing a cost function that includes a quantity of non-zero weight values for the weight values.

In some embodiments, the method further includes minimizing a cost function with an optimization function including gradient descent, back-propagation, or both gradient descent and back-propagation. An estimate of power consumption of the neuromorphic integrated circuit is used as a component of the cost function.

In some embodiments, the weight values correspond to synaptic weight values between neural nodes in the neural network of the neuromorphic integrated circuit.

In some embodiments, the method further includes incorporating the neuromorphic integrated circuit in one or more ASSPs selected from keyword spotting, speaker identification, one or more audio filters, gesture recognition, image recognition, video object classification and segmentation, and autonomous vehicles including drones.

In some embodiments, the neuromorphic integrated circuit is configured to operate on battery power.

DRAWINGS

Embodiments of this disclosure are illustrated by way of example and not by way of limitation in the figures of the accompanying drawings, in which like references indicate similar elements and in which:

Figure 1:
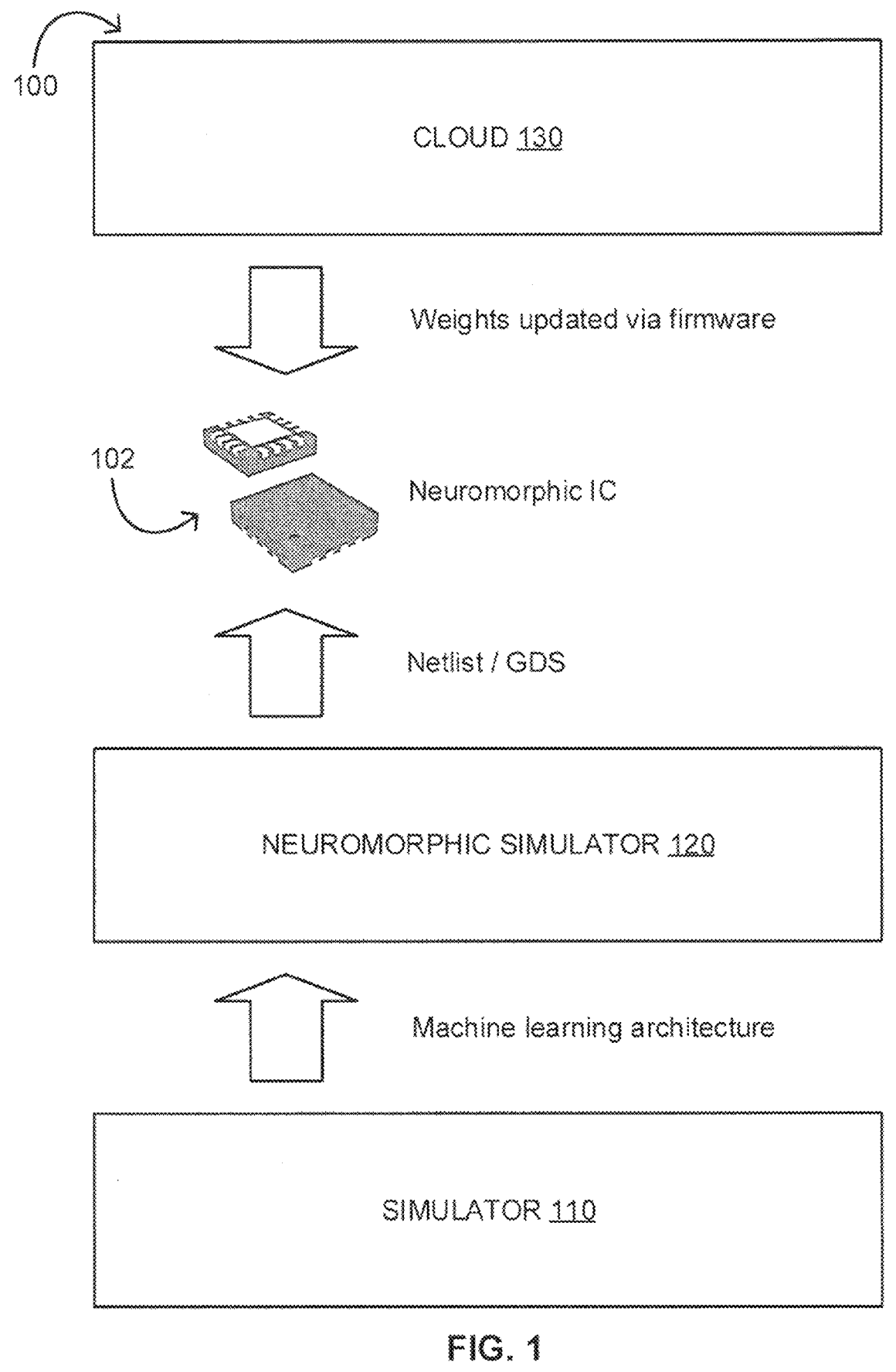

FIG. 1 provides a schematic illustrating a system 100 for designing and updating neuromorphic integrated circuits ("ICs") in accordance with some embodiments.

FIG. 2 provides a schematic illustrating an analog multiplier array in accordance with some embodiments.

Figure 3:
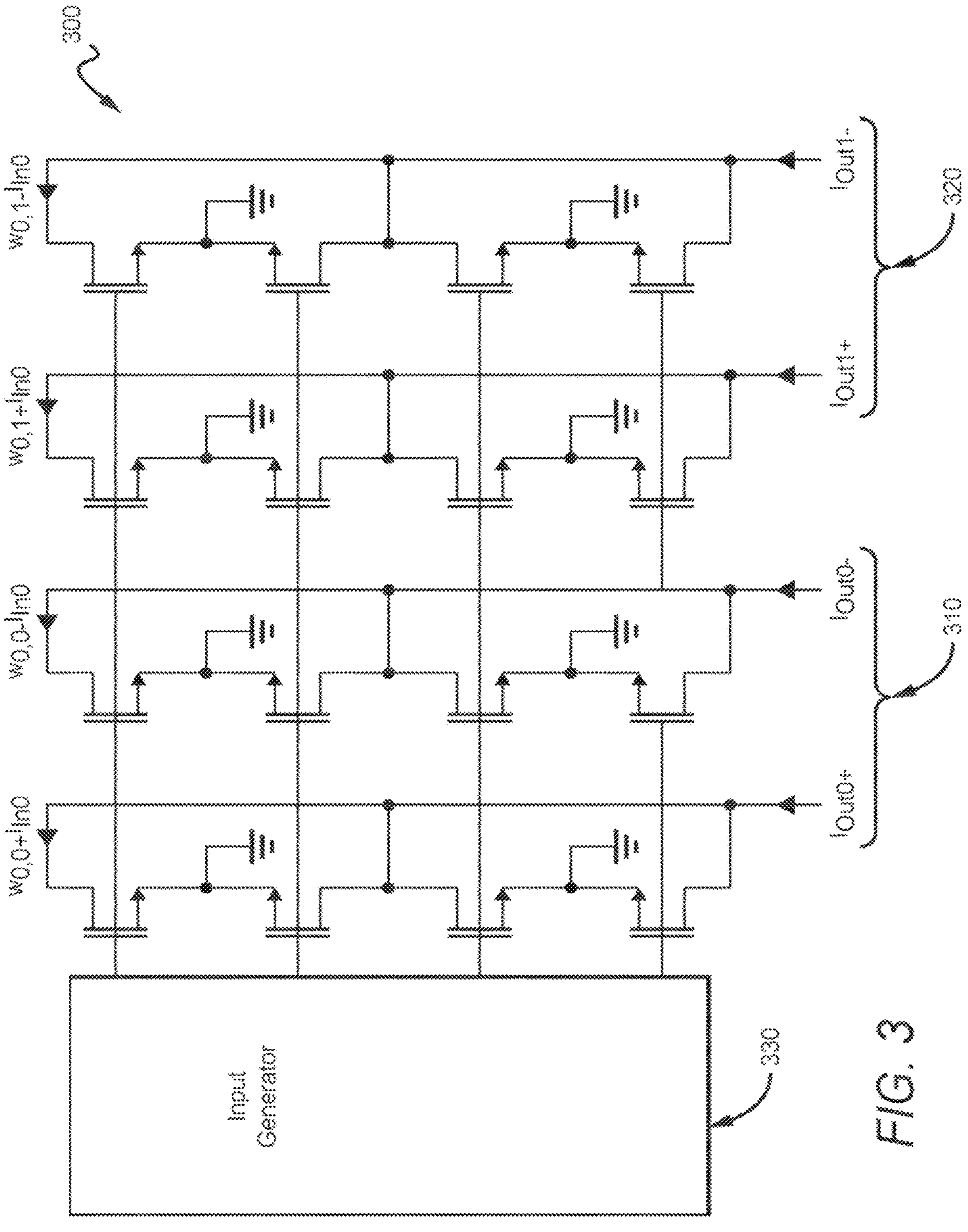

FIG. 3 provides a schematic illustrating an analog multiplier array in accordance with some embodiments.

Figure 4:
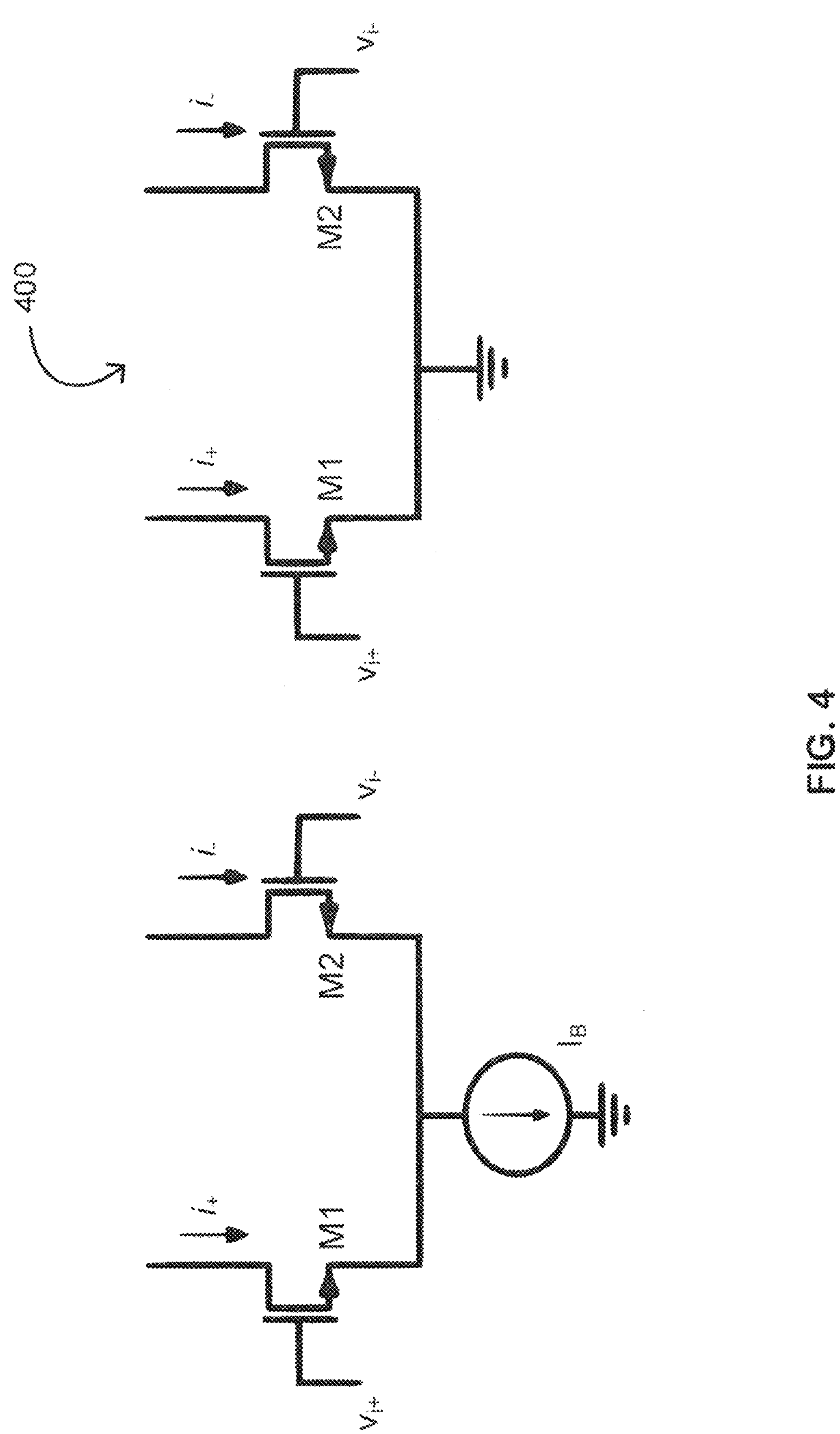

FIG. 4 provides a schematic illustrating a bias-free, two-quadrant multiplier of an analog multiplier array in accordance with some embodiments.

DESCRIPTION

Terminology

In the following description, certain terminology is used to describe features of the invention. For example, in certain situations, the term "logic" may be representative of hardware, firmware and/or software that is configured to perform one or more functions. As hardware, logic may include circuitry having data processing or storage functionality. Examples of such circuitry may include, but are not limited or restricted to a microprocessor, one or more processor cores, a programmable gate array, a microcontroller, a controller, an application specific integrated circuit, wireless receiver, transmitter and/or transceiver circuitry, semiconductor memory, or combinatorial logic.

The term "process" may include an instance of a computer program (e.g., a collection of instructions, also referred to herein as an application). In one embodiment, the process may be included of one or more threads executing concurrently (e.g., each thread may be executing the same or a different instruction concurrently).

The term "processing" may include executing a binary or script or launching an application in which an object is processed, wherein launching should be interpreted as placing the application in an open state and, in some implementations, performing simulations of actions typical of human interactions with the application.

The term "object" generally refers to a collection of data, whether in transit (e.g., over a network) or at rest (e.g., stored), often having a logical structure or organization that enables it to be categorized or typed. Herein, the terms "binary file" and "binary" will be used interchangeably.

The term "file" is used in a broad sense to refer to a set or collection of data, information or other content used with a computer program. A file may be accessed, opened, stored, manipulated or otherwise processed as a single entity, object or unit. A file may contain other files and may contain related or unrelated contents or no contents at all. A file may also have a logical format or be part of a file system having a logical structure or organization of plural files. Files may have a name, sometimes called simply the "filename," and often appended properties or other metadata. There are many types of files, such as data files, text files, program files, and directory files. A file may be generated by a user of a computing device or generated by the computing device. Access and/or operations on a file may be mediated by one or more applications and/or the operating system of a computing device. A filesystem may organize the files of the computing device of a storage device. The filesystem may enable tracking of files and enable access of those files. A filesystem may also enable operations on a file. In some embodiments the operations on the file may include file creation, file modification, file opening, file reading, file writing, file closing, and file deletion.

Lastly, the terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps or acts are in some way inherently mutually exclusive.

Referring now to FIG. 1, a schematic illustrating a system 100 for designing and updating neuromorphic ICs is provided in accordance with some embodiments. As shown, the system 100 can include a simulator 110, a neuromorphic synthesizer 120, and a cloud 130 configured for designing and updating neuromorphic ICs such as neuromorphic IC 102. As further shown, designing and updating neuromorphic ICs can include creating a machine learning architecture with the simulator 110 based on a particular problem. The neuromorphic synthesizer 120 can subsequently transform the machine learning architecture into a netlist directed to the electronic components of the neuromorphic IC 102 and the nodes to which the electronic components are connected. In addition, the neuromorphic synthesizer 120 can transform the machine learning architecture into a graphic database system ("GDS") file detailing the IC layout for the neuromorphic IC 102. From the netlist and the GDS file for the neuromorphic IC 102, the neuromorphic IC 102, itself, can be fabricated in accordance with current IC fabrication technology. Once the neuromorphic IC 102 is fabricated, it can be deployed to work on the particular problem for which it was designed. While the initially fabricated neuromorphic IC 102 can include an initial firmware with custom synaptic weights between the nodes, the initial firmware can be updated as needed by the cloud 130 to adjust the weights. Being as the cloud 130 is configured to update the firmware of the neuromorphic IC 102, the cloud 130 is not needed for everyday use.

Neuromorphic ICs such as the neuromorphic IC 102 can be up to 100x or more energy efficient than graphics processing unit ("GPU") solutions and up to 280x or more energy efficient than digital CMOS solutions with accuracies meeting or exceeding comparable software solutions. This makes such neuromorphic ICs suitable for battery powered applications.

Neuromorphic ICs such as the neuromorphic IC 102 can be configured for an ASSP including, but not limited to, keyword spotting, speaker identification, one or more audio filters, gesture recognition, image recognition, video object classification and segmentation, or autonomous vehicles including drones. For example, if the particular problem is one of keyword spotting, the simulator 110 can create a machine learning architecture with respect to one or more aspects of keyword spotting. The neuromorphic synthesizer 120 can subsequently transform the machine learning architecture into a netlist and a GDS file corresponding to a neuromorphic IC for keyword spotting, which can be fabricated in accordance with current IC fabrication technology. Once the neuromorphic IC for keyword spotting is fabricated, it can be deployed to work on keyword spotting in, for example, a system or device.

Neuromorphic ICs such as the neuromorphic IC 102 can be deployed in toys, sensors, wearables, augmented reality ("AR") systems or devices, mobile systems or devices, appliances, Internet of things ("IoT") devices, or hearables.

Referring now to FIG. 2, a schematic illustrating an analog multiplier array 200 is provided in accordance with some embodiments. Such an analog multiplier array can be based on a digital NOR flash array in that a core of the analog multiplier array can be similar to a core of the digital NOR flash array or the same as a core of the digital NOR flash array. That said, at least select and read-out circuitry of the analog multiplier array are different than a digital NOR array. For example, output current is routed as an analog signal to a next layer rather than over bit lines going to a sense-amp/comparator to be converted to a bit. Word-line analogs are driven by analog input signals rather than a digital address decoder. Furthermore, the analog multiplier array 200 can be used in neuromorphic ICs such as the neuromorphic IC 102. For example, a neural network can be disposed in the analog multiplier array 200 in a memory sector of a neuromorphic IC.

Since the analog multiplier array 200 is an analog circuit, input and output current values (or signal values) can vary in a continuous range instead of simply on or off. This is useful for storing weights (aka coefficients) of a neural network as opposed to digital bits. In operation, the weights can be multiplied by input current values 231, 232, 233, 234 to provide output current values that are combined to arrive at a decision of the neural network. In embodiments, the input current values 231,232,233,234 are provided by an input generator 230. Furthermore, stored charge within a multiplier 210 can shift voltage on the floating gate and scales drain current by weight wij.

The analog multiplier array 200 can utilize standard programming and erase circuitry to generate tunneling and erase voltages.

Referring now to FIG. 3, a schematic illustrating an analog multiplier array 300 is provided in accordance with some embodiments. The analog multiplier array 300 can use two transistors (e.g., a positive metal-oxide-semiconductor field-effect transistor ["MOSFET"] and a negative MOSFET) to perform a two-quadrant multiplication of a signed weight (e.g., a positive weight or a negative weight) and a non-negative input current value. In embodiments, the input current values can be provided by a separate input generator 330, where the input generator 330 can be similar to that of the input generator 230 depicted in FIG. 2. If an input current value provided by the input generator 330 is multiplied by a positive or negative weight, the product or output current value can respectively be either positive or negative. A positively weighted product can be stored in a first column (e.g., column corresponding to $I_{Out0}+$ in the analog multiplier array 300), and a negatively weighted product can be stored in a second column (e.g., column corresponding to /ow- in the analog multiplier array 300). By way of example and not limitation, $I_{Out0}+$ and $I_{Out0}-$ can be taken as differential current output 310 that then is provided to a plurality of current-sensing circuitry including but not limited to, current mirrors, charge integrators, and/or transimpedance amplifiers. The foregoing differential outputs 310, 320 positively and negatively weighted products or output signal values can be taken as a differential current value to provide useful information for making a decision.

Because each output current from the positive or negative transistor is wired to ground and proportional to the product of the input current value and the positive or negative weight, respectively, the power consumption of the positive or negative transistor is near zero when the input current values or weights are at or near zero. That is, if the input signal values are '0,' or if the weights are '0,' then no power will be consumed by the corresponding transistors of the analog multiplier array 300. This is significant because in many neural networks, often a large fraction of the values or the weights are '0,' especially after training. Therefore, energy is saved when there is nothing to do or going on, particularly when sparsity (many zeros) is encouraged in the neural networks of such multipliers during the training. This is unlike differential pair-based multipliers, which consume a constant current (e.g., by means of a tail bias current $I_B$) regardless of the input signal.

Referring now to FIG. 4, a schematic illustrating a bias-free two-quadrant multiplier 400 of an analog multiplier array such as the analog multiplier array 300 is provided in accordance with some embodiments. As previously set forth, because each output current from the positive transistor (e.g., M1 of the two-quadrant multiplier 400) or negative transistor (e.g., M2 of the two-quadrant multiplier 400) is proportional to the product of the input current value and the positive or negative weight, respectively, the power consumption of the positive or negative transistor is near zero (or zero) when the input current values or weights are near zero (or zero). This is unlike differential pair-based multipliers, which consume a constant current (e.g., by means of a tail bias current IB) regardless of the input signal.

Substantial power savings can be realized when sparsity (many zeros) is encouraged in neural networks composed of such bias-free two-quadrant multipliers via training. That is, a neural network disposed in an analog multiplier array of a number of two-quadrant multipliers in a memory sector of a neuromorphic integrated circuit can be trained to encourage sparsity in the neural network, thereby minimizing power consumption of the neuromorphic IC. Before the neural network is trained, a subset of the weight values can even be set to zero, thereby further encouraging sparsity in the neural network and minimizing power consumption of the neuromorphic IC. Indeed, the power consumption of the neuromorphic IC can be minimized such that the neuromorphic IC can operate on battery power.

Training the neural network can include training with a training algorithm configured to drive a substantial number of the input current values, the weight values, or the combination thereof toward zero for the number of multipliers, thereby encouraging sparsity in the neural network and minimizing power consumption of the neuromorphic IC. The training can be iterative, and the weight values can be adjusted with each iteration of the training. The training algorithm can be further configured to track a rates of change for the weight values of each multiplier of the number of the multipliers to drive the weight values toward zero. Rates of change for weight values can be used to determine if certain weight values are trending toward zero and how quickly the weight values are trending toward zero, which can be used in the training to more quickly drive the weight values toward zero such as by programming the weight values to be approximately zero or zero. In addition, training the neural network and encourage sparsity in the neural network can include minimizing a cost function that includes a quantity of non-zero weight values for the weight values. Minimizing the cost function can include using an optimization function including gradient descent, back-propagation, or both gradient descent and back-propagation. An estimate of power consumption of the neuromorphic integrated circuit can be used as a component of the cost function.

When programming a two-quadrant multiplier such as the bias-free, two-quadrant multiplier 400, it is common to erase each programmable cell (e.g., the cell including transistor M1 and the cell including transistor M2) thereof to set the cells to one extreme weight value before setting each of the cells to its target weight value. Extending this to a full array such as the analog multiplier array 300, all of the programmable cells in the full array are set to one extreme weight value before setting each of the cells to its target weight value. When setting the cells to their desired weight values, a problem of overshoot exists if one or more of the cells is set with a higher weight value than targeted. That is all of the cells in the full array must be reset to the one extreme weight value before resetting the cells to their target weight values. However, the differential structure of each of the bias-free, two-quadrant multipliers of the analog multiplier arrays provided herein allows for compensating such overshoot by programming, thereby obviating the time-consuming process of erasing and resetting all of the cells in an array.

In an example of compensating for overshoot by programming, $v_{i-}$ and $v_{i+}$ of the two-quadrant multiplier 400 can be erased to set the cells to one extreme weight value. After erasing the cells, if $v_{i-}$ is programmed with too large a weight value, $v_{i+}$ can be programmed with a larger weight value than initially targeted to compensate for the weight value of $v_{i-}$ and achieve the initially targeted effect. Therefore, the differential structure can be exploited to compensate for programming overshoot without having to erase any one or more cells and start over.

The foregoing systems and methods encourage sparsity in neural networks of neuromorphic ICs and minimize power consumption of the neuromorphic ICs such that the neuromorphic ICs can be operated on battery power.

In the foregoing description, the invention is described with reference to specific exemplary embodiments thereof. It will, however, be evident that various modifications and changes may be made thereto without departing from the broader spirit and scope of the invention as set forth in the appended claims.

What is claimed is:

1. A neuromorphic integrated circuit, comprising:

a multi-layered neural network disposed in an analog multiplier array of a plurality of two-quadrant multipliers arranged in a memory sector of the neuromorphic integrated circuit, wherein at least one of the plurality of two-quadrant multipliers is a bias-free two-quadrant multiplier, wherein each multiplier of the multipliers is wired to ground and draws a reduced amount of current when input signal values for input signals to transistors of the multiplier are near zero or zero, weight values of the transistors of the multiplier are near zero or zero, or a combination thereof, wherein each bias-free two-quadrant multiplier of the two-quadrant multipliers has a differential structure configured to allow programmatic compensation for overshoot if any one of two cells is set with a higher weight value than targeted; and wherein the differential structure is coupled to current-sensing circuitry comprising at least one of a current mirror, a charge integrator, or a transimpedance amplifier.

2. The integrated circuit of claim 1, wherein programmatic compensation for overshoot is performed by increasing a second weight value of a second cell of the two cells above an initially targeted weight value upon a determination that a first weight value of a first cell of the two cells is above a set value.

3. The integrated circuit of claim 1, wherein sparsity in the neural network combined with the number of multipliers wired to ground reduces power consumption of the neuromorphic integrated circuit.

4. The integrated circuit of claim 1, wherein each multiplier of the multipliers draws no current when the input signal values for the input signals to the transistors of the multiplier are zero, the weight values of the transistors of the multiplier are zero, or a combination thereof.

5. The integrated circuit of claim 1, wherein the weight values correspond to synaptic weight values between neural nodes in the neural network disposed in the neuromorphic integrated circuit.

6. The integrated circuit of claim 5, wherein input signal values multiplied by the weight values provide output signal values that are combined to arrive at a decision of the neural network.

7. The integrated circuit of claim 1, wherein the transistor of the two-quadrant multipliers includes a metal-oxide-semiconductor field-effect transistor ("MOSFET").

8. The integrated circuit of claim 1, wherein the neuromorphic integrated circuit is configured for one or more application specific standard products ("ASSPs") selected from keyword spotting, speaker identification, one or more audio filters, gesture recognition, image recognition, video object classification and segmentation, and autonomous vehicles including drones.

9. The integrated circuit of claim 1, wherein the neuromorphic integrated circuit is configured to operate on battery power.

10. A method for compensation for overshoot in a neuromorphic integrated circuit, comprising:

training a multi-layered neural network disposed in an analog multiplier array of a plurality of two-quadrant multipliers in a memory sector of the neuromorphic integrated circuit, wherein at least one of the plurality of two-quadrant multipliers is a bias-free two-quadrant multiplier, wherein each multiplier of the multipliers is wired to ground and draws a first amount of current when input signal values for input signals to transistors of the multiplier are near zero or zero, weight values of the transistors of the multiplier are near zero or zero, or a combination thereof;

wherein each bias-free two-quadrant multiplier of the two-quadrant multipliers has a differential structure configured to allow programmatic compensation for overshoot if any one of two cells is set with a higher weight value than targeted; and processing a differential current output from the differential structure using current-sensing circuitry comprising at least one of a current mirror, a charge integrator, or a transimpedance amplifier.

11. The method of claim 10, wherein the programmatic compensation for overshoot comprises:

determining whether a first weight value of a first cell of the two cells is above a set value; and increasing a second weight value of a second cell of the two cells so that the second weight value is above an initially targeted weight value of the second cell.

12. The method of claim 10, further comprising:

encouraging sparsity in the neural network by training with a training algorithm configured to drive a substantial number of the input signal values, the weight values, or the combination thereof toward zero for the multipliers, thereby enabling minimal power consumption by the neuromorphic integrated circuit.

13. The method of claim 10, wherein each multiplier of the multipliers draws no current when the input signal values for the input signals to the transistors of the multiplier are zero, the weight values of the transistors of the multiplier are zero, or a combination thereof.

14. The method of claim 10, further comprising:

tracking rates of change for the weight values of each multiplier of the multipliers during the training;

determining if certain weight values are trending toward zero and how quickly those certain weight values are trending toward zero; and driving the weight values toward zero for those weight values that are trending toward zero during training as part of encouraging sparsity in the neural network.

15. The method of claim 10, wherein the training is an iterative training and the weight values are adjusted with each iteration of the training.

16. The method of claim 10, wherein the weight values correspond to synaptic weight values between neural nodes in the neural network of the neuromorphic integrated circuit.

17. The method of claim 10, further comprising:

minimizing a cost function that includes a quantity of non-zero weight values for the weight values with an optimization function including gradient descent, back-propagation, or both gradient descent and back-propagation, wherein an estimate of power consumption of the neuromorphic integrated circuit is used as a component of the cost function.

18. The method of claim 10, further comprising:

setting a subset of the weight values to zero before training the neural network to encourage sparsity in the neural network.

* * * * *